United States Patent [19]
Yuri et al.

[11] Patent Number: 6,150,674
[45] Date of Patent: Nov. 21, 2000

[54] SEMICONDUCTOR DEVICE HAVING $AL_xGA_{1-x}N$ (0<X<1) SUBSTRATE

[75] Inventors: Masaaki Yuri; Osamu Imafuji; Shinji Nakamura; Kenji Orita, all of Osaka, Japan

[73] Assignee: Matsushita Electronics Corporation, Osaka, Japan

[21] Appl. No.: 09/434,005

[22] Filed: Nov. 4, 1999

[30] Foreign Application Priority Data

Nov. 6, 1998 [JP] Japan ................................. 10-315862

[51] Int. Cl.[7] .................................................. H01L 33/00
[52] U.S. Cl. .............................. 257/103; 257/94; 257/12; 257/13
[58] Field of Search ................................ 257/12, 13, 94, 257/103, 184

[56] References Cited

U.S. PATENT DOCUMENTS

5,247,533  9/1993  Okazaki et al. ........................ 257/12

FOREIGN PATENT DOCUMENTS

| | | |
|---|---|---|
| 0 377 940 A2 | 7/1990 | European Pat. Off. |
| 0 647 730 A2 | 4/1995 | European Pat. Off. |
| 10173228 | 6/1998 | Japan . |
| 10256662 | 9/1998 | Japan . |

OTHER PUBLICATIONS

"HVPE GaN and AlGaN 'Substrates' for Homoepitaxy", by Melnik, et al., in Materials Science Forum vols. 264–268 (1998), pp. 1121–1124.

"Novel AlN/GaN Insulated Gate Heterostructure Field Effect Transistor with Modulation Doping and One–Dimensional Simulation of Charge Control", by Imanaga, et al., in J. Appl. Phys. 82 (11), Dec. 1, 1997, pp. 5843–5858.

"InGaN/GaN/AlGaN–based Laser Diodes with Modulation–Doped Strained–Layer Superlattices Grown on an Epitaxially Laterlly Overgrown GaN Substrate", by Nakamura, et al., in Appl. Phys. Lett. 72 (2) Jan. 12, 1998, pp. 211–213.

"AlxGa1–2N Based Materials and Heterostructures", by Kung, et al., in Mat. Res. SOc. SYmp. Proc. vol. 449, 1997, Materials Research Society, pp. 79–84.

*Primary Examiner*—Minh Loan Tran
*Attorney, Agent, or Firm*—Michael K. Kelly; Snell & Wilmer, LLP

[57] ABSTRACT

A semiconductor device includes a substrate formed of $Al_xGa_{1-x}N$ (0<x<1) and a first semiconductor layer provided on the substrate and formed of a III-group nitride semiconductor containing Al. The difference between an Al ratio of the substrate and an Al ratio of the first semiconductor layer is less than about 0.15.

4 Claims, 4 Drawing Sheets

SEMICONDUCTOR DEVICE HAVING $AL_xGA_{1-x}N$ (0<X<1) SUBSTRATE

BACKGROUND OF THE INVENTION

1. Field of the Invention

The present invention relates to a semiconductor device, and specifically to a light emitting device using a gallium nitride compound semiconductor.

2. Description of the Related Art

III-V group gallium nitride compound semiconductors represented by, for example, gallium nitride (GaN), indium nitride (InN), and aluminum nitride (AlN) have a wide band gap of 1.9 to 6.2 eV and are expected to be used as materials for light emitting and light receiving devices covering the visible to ultraviolet light bands. A promising candidate of such a light source used for a super-high density optical disc which has been a subject of active research and development is a blue-violet semiconductor light emitting device for emitting light having an oscillating wavelength around 400 nm which can be realized by such materials.

In the field of gallium nitride compound semiconductor light emitting devices, it is conventionally known to use $In_xGa_{1-x}N$ ($0.1 \leq x \leq 0.2$) for an active layer in order to provide laser light having a wavelength of around 400 nm. It is also conventionally known to use $Al_yGa_{1-y}N$ ($0 \leq y \leq 1$) for a clad layer as a material having a refractive index smaller than that of the active layer, in order to effectively confine the light.

Such a gallium nitride compound semiconductor light emitting device is conventionally fabricated to include a sapphire ($Al_2O_3$), silicon carbide (SiC) or gallium nitride substrate by using metal organic chemical vapor deposition (MOCVD)

Hereinafter, a conventional gallium nitride compound semiconductor light emitting device will be described with reference to FIG. 4.

FIG. 4 is a cross-sectional view of the conventional gallium nitride compound semiconductor light emitting device. As shown in FIG. 4, the gallium nitride compound semiconductor light emitting device includes a sapphire substrate 1 and the following layers sequentially provided on the sapphire substrate 1: a buffer layer 2 formed of GaN, an n-type contact layer 3 formed of n-type GaN, an n-type clad layer 4 formed of n-type $Al_yGa_{1-y}N$ ($0<y1 \leq 1$), an active layer 5 having a multiple quantum well structure including a plurality of $In_{0.15}Ga_{0.85}N$ well layers (not shown) and a plurality of $In_{0.05}Ga_{0.95}N$ barrier layers (not shown) which are alternately layered, a p-type clad layer 6 formed of p-type $Al_{y2}Ga_{1-y2}N$ ($0<y2 \leq 1$), and a p-type contact layer 7 formed of p-type GaN. The gallium nitride compound semiconductor light emitting device further includes an n-type ohmic electrode 8 provided on the n-type contact layer 3 and a p-type ohmic electrode 9 provided on the p-type contact layer 7, as shown in FIG. 4.

The buffer layer 2 is provided for alleviating the lattice mismatch between the sapphire substrate 1 and the layers 3 through 7 formed of the gallium nitride compound semiconductors, especially, the n-type contact layer 3, and for improving the crystallinity of the layers 3 through 7 formed of the gallium nitride compound semiconductors. The n-type contact layer 3 usually has a thickness of about 2 μm or more in order to further improve the crystallinity of the layers 3 through 7.

In order to sufficiently confine light generated in the active layer 5, the Al ratio (the ratio of Al to the other elements in the compound) or the thickness of both the n-type clad layer 4 and the p-type clad layer 6 need to be increased.

The conventional gallium nitride compound semiconductor light emitting device has the following problems.

(1) $Al_zGa_{1-z}N$ ($0<Z \leq 1$) has a hardness higher than that of $Al_2O_3$ or GaN, and this relationship tends to increase as the Al ratio is increased. Consequently, when the n-type clad layer 4 or the p-type clad layer 6 formed of $Al_zGa_{1-z}N$ having a thickness less than that of the sapphire substrate 1 is provided above the sapphire substrate 1, dislocations or cracks are generated in the n-type clad layer 4 or the p-type clad layer 6 in a concentrated manner by the lattice mismatch between the sapphire substrate 1 and the n-type clad layer 4 or the p-type clad layer 6. The generation of these dislocations or cracks becomes more significant as the Al ratio is increased.

When the n-type clad layer 4 is provided on the n-type contact layer 3, a larger thickness or a higher Al ratio of the n-type clad layer 4 is likely to generate dislocations or cracks in the n-type clad layer 4. The reason for this is that $Al_zGa_{1-z}N$ has a lattice constant less than that of GaN and this relationship tends to increase as the Al ratio is increased. The dislocations or cracks generated in the n-type clad layer 4 spread throughout the entirety of the gallium nitride compound semiconductor light emitting device, resulting in deterioration in the characteristics of the device.

(2) $Al_zGa_{1-z}N$ ($0<Z \leq 1$) has a thermal expansion coefficient greater than that of GaN, and this relationship tends to increase as the Al ratio is increased. Consequently, even though the crystallinity of the n-type clad layer 4 and the p-type clad layer 6 is satisfactory during crystal growth, a tensile strain is applied to the n-type clad layer 4 and the p-type clad layer 6 when the temperature is lowered from the crystal growth temperature to room temperature. As a result, dislocations or cracks are generated in the gallium nitride compound semiconductor light emitting device, with the generation of cracks becoming significant especially as the Al ratio is increased.

When the thickness of the n-type clad layer 4 and the p-type clad layer 6 is reduced in order to avoid the above-described problems, the light is not sufficiently confined in the active layer 5.

Due to the above-described problems, the conventional gallium nitride compound semiconductor light emitting device involves a defect density of about $10^9 cm^{-2}$ and crack generation, which reduces the light emitting efficiency. Consequently, the conventional gallium nitride compound semiconductor light emitting device has inferior characteristics, represented by a threshold current of as high as about 60 mA.

SUMMARY OF THE INVENTION

A semiconductor device according to the present invention includes a substrate formed of $Al_xGa_{1-x}N$ (0<x<1) and a first semiconductor layer provided on the substrate and formed of a III-group nitride semiconductor containing Al. The difference between an Al ratio of the substrate and an Al ratio of the first semiconductor layer is less than about 0.15.

In one embodiment of the invention, the semiconductor device further includes an active layer provided on the first semiconductor layer and formed of a III-group nitride semiconductor having a forbidden band smaller than a forbidden band of the first semiconductor layer; and a second semiconductor layer provided on the active layer and formed of a III-group nitride semiconductor containing Al and having a different conductivity type from a conductivity type of the first semiconductor layer.

In one embodiment of the invention, the difference between the Al ratio of the substrate and an Al ratio of the second semiconductor layer is less than about 0.15, and the difference between the Al ratio of the first semiconductor layer and the Al ratio of the second semiconductor layer is less than about 0.15.

In one embodiment of the invention, the substrate has a thickness of about 20 μm or more.

Thus, the invention described herein makes possible the advantages of providing a gallium nitride compound semiconductor light emitting device having a satisfactorily low threshold current while sufficiently confining light in an active layer without generating cracks.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
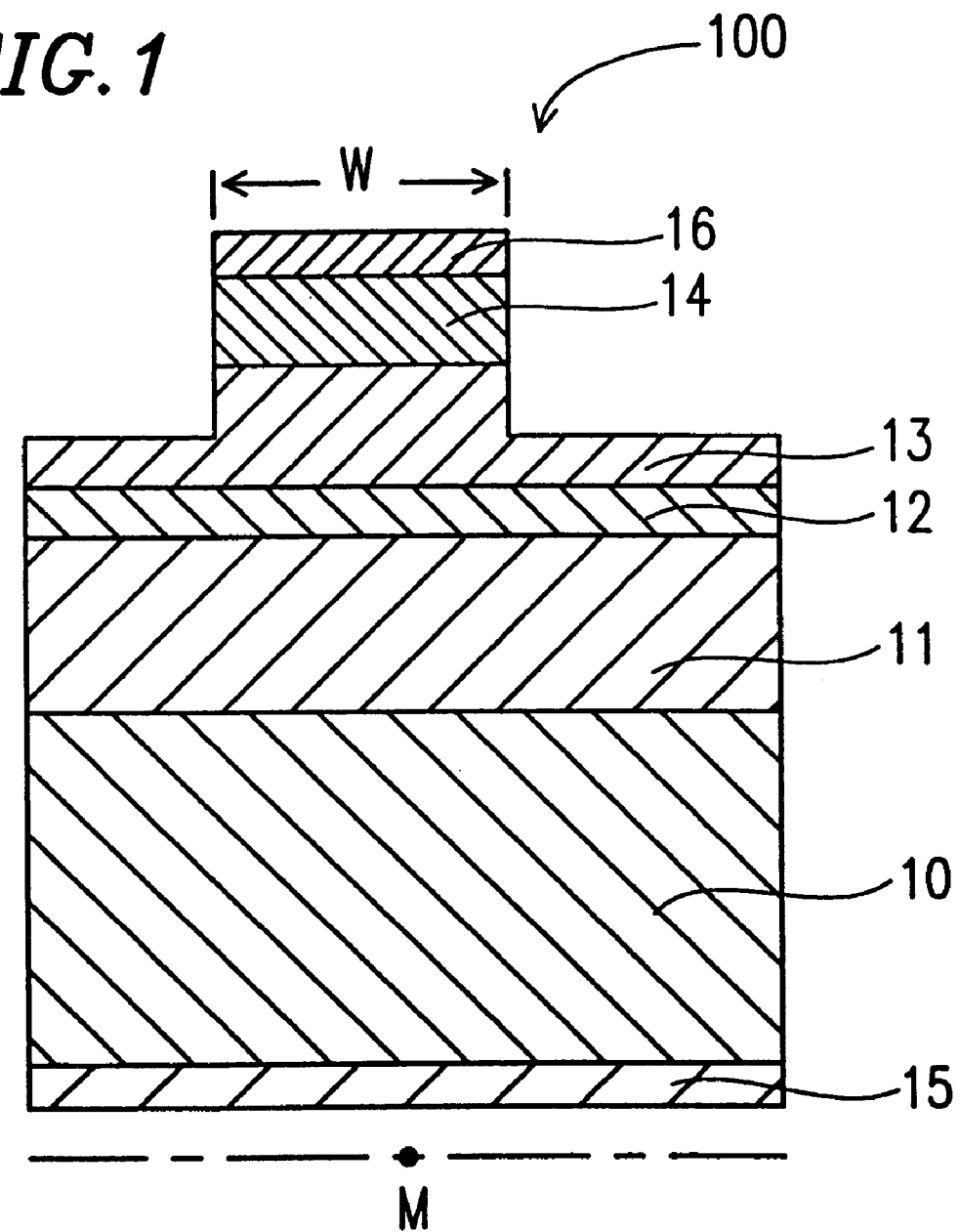
FIG. 1 is a cross-sectional view of a gallium nitride compound semiconductor light emitting device in one example according to the present invention.

FIG. 1 is a cross-sectional view of a gallium nitride compound semiconductor light emitting device 100 in one example according to the present invention. As shown in FIG. 1, the gallium nitride compound semiconductor light emitting device 100 includes a substrate 10 formed of n-type $Al_{0.1}Ga_{0.9}N$ with silicon added thereto (thickness: about 100 μm; carrier density: $5\times10^{18}cm^{-3}$) and the following layers sequentially provided on a surface of the substrate 10: an n-type clad layer 11 (first semiconductor layer) formed of n-type $Al_{0.15}Ga_{0.85}N$ (band gap: about 3.68 eV; thickness: about 1.0 μm), an active layer 12 having a multiple quantum well structure including ten $In_{0.15}Ga_{0.85}N$ well layers (band gap: about 2.76 eV; thickness: about 3 nm each; not shown) and ten $In_{0.05}Ga_{0.95}N$ barrier layers (band gap: about 3.16 eV; thickness: about 5 nm each; not shown) which are alternately layered, a p-type clad layer 13 (second semiconductor layer) formed of p-type $Al_{0.15}Ga_{0.85}N$ (thickness: 1.0 μm), and a p-type contact layer 14 formed of p-type GaN (thickness: about 1.5 μm). The gallium nitride compound semiconductor light emitting device 100 further includes an n-type ohmic electrode 15 provided on a surface of the substrate 10 opposite to the surface on which the n-type clad layer 11 is provided, and a p-type ohmic electrode 16 provided on the p-type contact layer 14.

The p-type clad layer 13 and the p-type contact layer 14 form a ridge having a width W for constricting the current.

The n-type clad layer 11 and the p-type clad layer 13 also act as optical waveguide layers.

The n-type clad layer 11 contains silicon and has a carrier density of $5\times10^{18}cm^{-3}$. The p-type clad layer 13 and the p-type contact layer 14 each contain magnesium and have a carrier density of $1\times10^{18}cm^{-3}$.

The n-type ohmic electrode 15 includes a titanium layer (thickness: about 10 nm; not shown) provided on the surface of the substrate 10 and an aluminum layer (thickness: about 0.3 μm; not shown) provided on the titanium layer. The p-type ohmic electrode 16 includes a nickel layer (thickness: about 0.1 μm; not shown) provided on a surface of the p-type contact layer 14 and a gold layer (thickness: about 0.3 μm; not shown) provided on the nickel layer.

The gallium nitride compound semiconductor light emitting device 100 has a cavity (not shown) acting as a resonator and having a length of about 1000 μm in a direction M perpendicular to the width direction of the gallium nitride compound semiconductor light emitting device 100, (i.e., the direction M is perpendicular to the sheet of FIG. 1). End surfaces of the cavity are coated with a high reflectivity film (not shown) including an $SiO_2$ layer and a $TiO_2$ layer.

Since the substrate 10 is formed of n-type $Al_{0.1}Ga_{0.9}N$, the differences in the lattice constant and in the thermal expansion coefficient between the substrate 10 and the n-type clad layer 11 and between the substrate 10 and the p-type clad layer 13 are less than those of the conventional device including a sapphire or GaN substrate. Since the substrate 10 has a hardness which is sufficiently large so as to generate dislocations in the substrate 10, the gallium nitride compound semiconductor light emitting device 100 has a significantly lower dislocation density and therefore, a significantly smaller number of cracks generated as compared with the conventional device.

The difference in the Al ratio between the substrate 10 and the first semiconductor layer 11 is preferably as small as possible in order to prevent cracks. The difference is preferably less than about 0.15, and more preferably 0.05 or less. In this example, the difference in the Al ratio between the substrate 10 formed of n-type $Al_{0.1}Ga_{0.85}N$ and the n-type clad layer 11 formed of n-type $Al_{0.15}Ga_{0.85}N$ is 0.05.

Since the difference in the Al ratio between the substrate 10 and the n-type clad layer 11 is 0.05 and the difference in the Al ratio between the substrate 10 and the p-type clad layer 13 is also 0.05, the thickness of each of the n-type clad layer 11 and the p-type clad layer 13 can be about 1.5 μm or more. As a result, light can be sufficiently confined within the active layer 12, which provides the gallium nitride compound semiconductor light emitting device 100 with characteristics superior to those of the conventional device.

It is preferable that the Al ratio of the substrate 10 is higher than the Al ratio of the n-type clad layer 11; i.e., y<x, where the substrate 10 is formed of n-type $Al_xGa_{1-x}N$ and the n-type clad layer 11 is formed of n-type $Al_yGa_{1-y}N$. Where the lattice constant of the substrate 10 is $a_s$ and the lattice constant of the n-type clad layer 11 is $a_1$, $a_s<a_1$. Since the lattice constant of the n-type clad layer 11 is larger than that of the substrate 10, a compression strain is applied to the n-type clad layer 11. The n-type clad layer 11 provided with the compression strain is less likely to cause cracks to be generated therein than an n-type clad layer provided with a tensile strain.

The gallium nitride compound semiconductor light emitting device 100 is fabricated in, for example, the following manner.

$Al_{0.1}Ga_{0.9}N$ with silicon added thereto is crystal-grown on a sapphire plate to a thickness of about 100 μm by hydride vapor phase epitaxial (HVPE), and then the sapphire plate is removed, thus forming the n-type $Al_{0.1}Ga_{0.9}N$ substrate 10.

Next, the n-type $Al_{0.1}Ga_{0.9}N$ substrate 10 is put into an MOCVD oven and is heated to 1000° C. in a mixed gas atmosphere of ammonia and hydrogen at a total atmosphere of 1 atm. Then, trimethyl aluminum (TMA), trimethyl gallium (TMG) and silane ($SiH_4$) are supplied to the inside of the oven, thus crystal-growing the n-type clad layer 11.

Then, the supply of TMA, TMG and $SiH_4$ is stopped, and the temperature of the substrate 10 is lowered to 800° C. TMG and trimethyl indium (TMI) are supplied to the inside of the oven, thus forming the active layer 12 having a multiple quantum well structure including ten $In_{0.15}Ga_{0.85}N$ well layers (thickness: 3 nm each; not shown) and ten $In_{0.05}Ga_{0.95}N$ barrier layers (thickness: 5 nm each; not shown) which are alternately layered.

The supply of TMG and TMI is stopped, and the temperature of the substrate 10 is raised to 1000° C. Then, TMA, TMG and cyclopentanedienyl magnesium ($Cp_2Mg$) are supplied to the inside of the oven, thus forming the p-type clad layer 13.

The supply of TMA is stopped, and the p-type contact layer 14 is formed. The resultant layer assembly is then taken out of the oven.

Then, the p-type clad layer 13 and the p-type contact layer 14 are dry-etched to form the ridge having a width W of about 2 μm which contains a part of the p-type clad layer 13 and the entirety of p-type contact layer 14. The n-type ohmic electrode 15 is formed on a surface of the substrate 10 opposite to the surface on which the n-type clad layer 11 is formed, and the p-type ohmic electrode 16 is formed on the p-type contact layer 14.

Next, the substrate 10 is cleaved to form a cavity having a length of about 1000 μm in a direction perpendicular to the longitudinal direction of the ridge. The end surfaces of the cavity are coated with a high reflectivity film including an $SiO_2$ layer and a $TiO_2$ layer.

Hereinafter, characteristics of the gallium nitride compound semiconductor light emitting device 100 will be described.

The gallium nitride compound semiconductor light emitting device 100 has an oscillating wavelength of about 410 nm. The oscillation threshold current of the device 100 is about 20 mA, which is significantly lower than that of the conventional device.

The gallium nitride compound semiconductor light emitting device 100 was observed with an optical microscope and a transmission electron microscope. The dislocation density was $10^6 cm^{-2}$, which is $10^{-3}$ times the density of the conventional device. No cracks were found in any of the layers.

In order to study the satisfactory characteristics of a gallium nitride compound semiconductor light emitting device according to the present invention, the following experiments were performed.

(Experiment 1)

$Al_tGa_{1-t}N$ substrates (thickness: 100 μm) were formed with different Al ratios (t), and then an $Al_sGa_{1-s}N$ layer ($0 \leq s \leq 1$) was crystal-grown on each of the substrates. The relationship between the Al ratio (t) and the maximum thickness of the $Al_sGa_{1-s}N$ layer which can be crystal-grown without crack generation was examined. The generation of cracks was determined by a surface observation using an optical microscope. The results are shown in FIG. 2.

Figure 2:
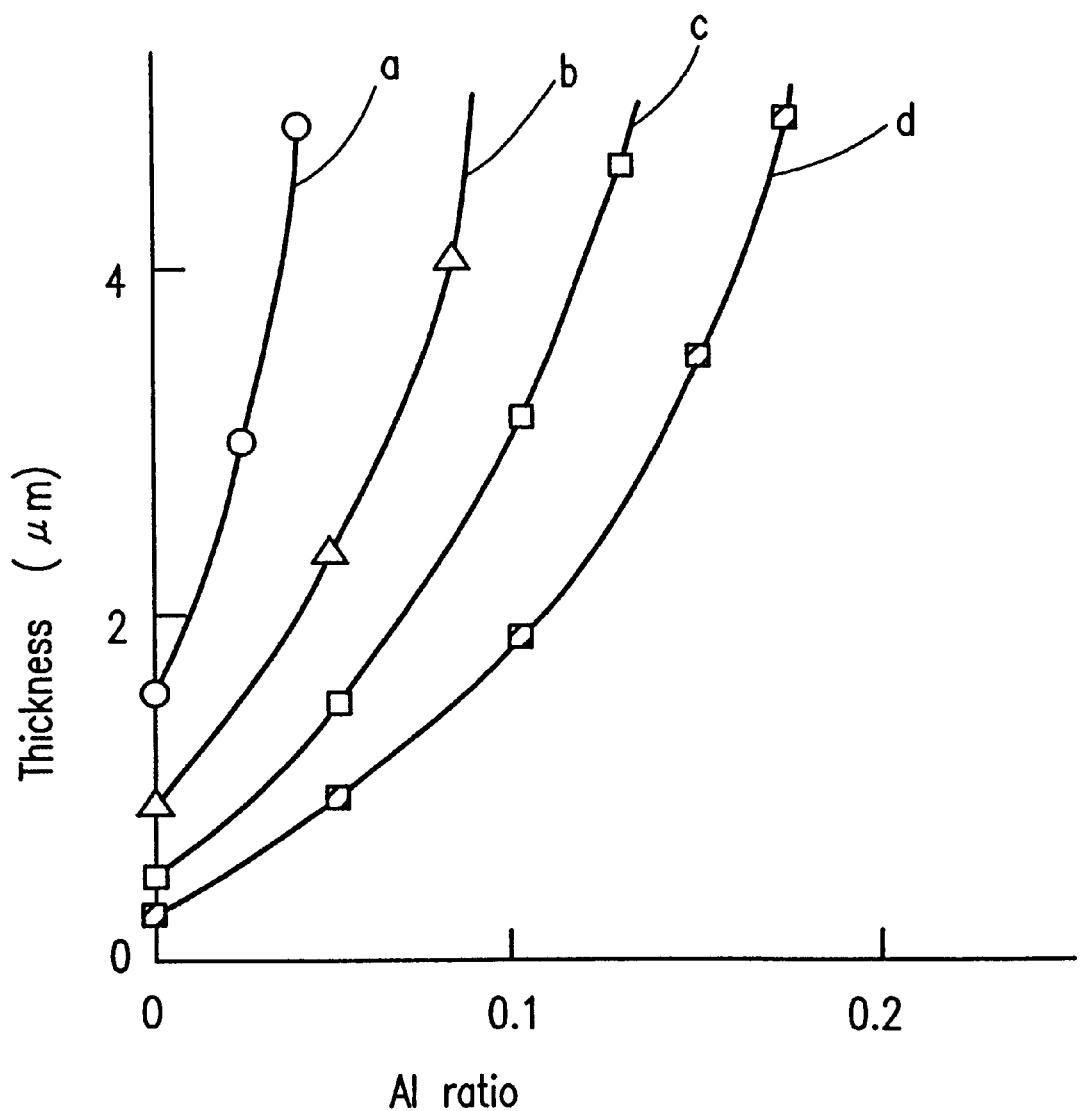
FIG. 2 is a graph illustrating the relationship among an Al ratio of an $Al_tGa_{1-t}N$ substrate, an Al ratio of an $Al_sGa_{1-s}N$ layer provided on the substrate and the maximum thickness of the $Al_sGa_{1-s}N$ layer which can be crystal-grown without crack generation.

In FIG. 2, curves a, b, and d, respectively represent the results obtained when s=0.05, s=0.10, s=0.15 and s=0.20. As can be appreciated from FIG. 2, as the difference between t and s is smaller, the $Al_sGa_{1-s}N$ layer can be crystal-grown to a greater thickness without crack generation. When t=0, i.e., when the substrate 10 is formed of GaN, the maximum thickness of the $Al_{0.15}Ga_{0.85}N$ layer which can be crystal-grown without crack generation is 0.5 μm. When the substrate 10 is formed of $Al_{0.1}Ga_{0.9}N$, the maximum thickness of the $Al_{0.15}Ga_{0.85}N$ layer which can be crystal-grown without crack generation is 3 μm. It is considered that this occurs since as the difference between t and s is smaller, the differences in the lattice constant and in the thermal expansion coefficient between the $Al_tGa_{1-t}N$ substrate and the $Al_sGa_{1-s}N$ layer are less; and as a result, the $Al_sGa_{1-s}N$ layer is less likely to cause cracks to be generated therein.

In FIG. 2, the upper limit of the Al ratio, s, at which the $Al_sGa_{1-s}N$ layer can be grown on a substrate formed of $Al_{0.05}Ga_{0.95}N$ to a thickness of 1 μm without generating cracks is about 0.2. Accordingly, the difference in the Al ratio, s, between the $Al_{0.05}Ga_{0.95}N$ substrate and the $Al_sGa_{1-s}N$ layer is about 0.15.

(Experiment 2)

On each of a GaN substrate and an $Al_{0.1}Ga_{0.9}N$ substrate (thickness: 100 μm each), an $Al_{0.15}Ga_{0.85}N$ layer was formed. The $Al_{0.15}Ga_{0.85}N$ layer on the GaN substrate caused cracks to be generated therein and had a dislocation density of $10^9 cm^{-2}$. The $Al_{0.15}Ga_{0.85}N$ layer on the $Al_{0.1}Ga_{0.9}N$ substrate did not cause cracks to be generated therein and had a dislocation density of $10^6 cm^{-2}$. This is considered to occur for the following reason in addition to the differences in the lattice constant and in the thermal expansion coefficient between the substrate and the $Al_{0.15}Ga_{0.85}N$ layer: the $Al_{0.1}Ga_{0.9}N$ substrate has a hardness greater than that of the GaN substrate and thus causes dislocations to be generated therein, and as a result, the $Al_{0.15}Ga_{0.85}N$ layer is less likely to cause dislocations to be generated therein.

As can be appreciated from the experiment results described above, the gallium nitride compound semiconductor light emitting device 100 according to the present invention has characteristics superior to those in the conventional device presumably for the following reasons: The n-type clad layer 11 and the p-type clad layer 13 provided on and above the n-type $Al_{0.1}Ga_{0.9}N$ substrate 10 are allowed to have a thickness of as great as about 1.0 μm and thus have a lower dislocation density and include less cracks than those in the conventional device. As a result, the light emitting efficiency is improved, and the light can be effectively confined in the active layer 12.

(Experiment 3)

As the thickness of the $Al_{0.4}Ga_{0.9}N$ substrate is less, the dislocation density of the gallium nitride compound semiconductor light emitting device is less. Specifically, when the thickness of the substrate is 40 μm, the dislocation density of the device is $10^5 cm^{-2}$. This is considered to occur because when the thickness of the substrate is sufficiently small so as to cause dislocations to be generated therein, the dislocations are unlikely to be generated in the n-type clad layer and other layers provided on the substrate.

$Al_{0.1}Ga_{0.9}N$ substrates were formed with different thicknesses in order to examine the relationship between the thickness of the $Al_{0.1}Ga_{0.9}N$ substrate and the production yield of the gallium nitride compound semiconductor light emitting device influenced by the cracks in the substrate.

Figure 3:
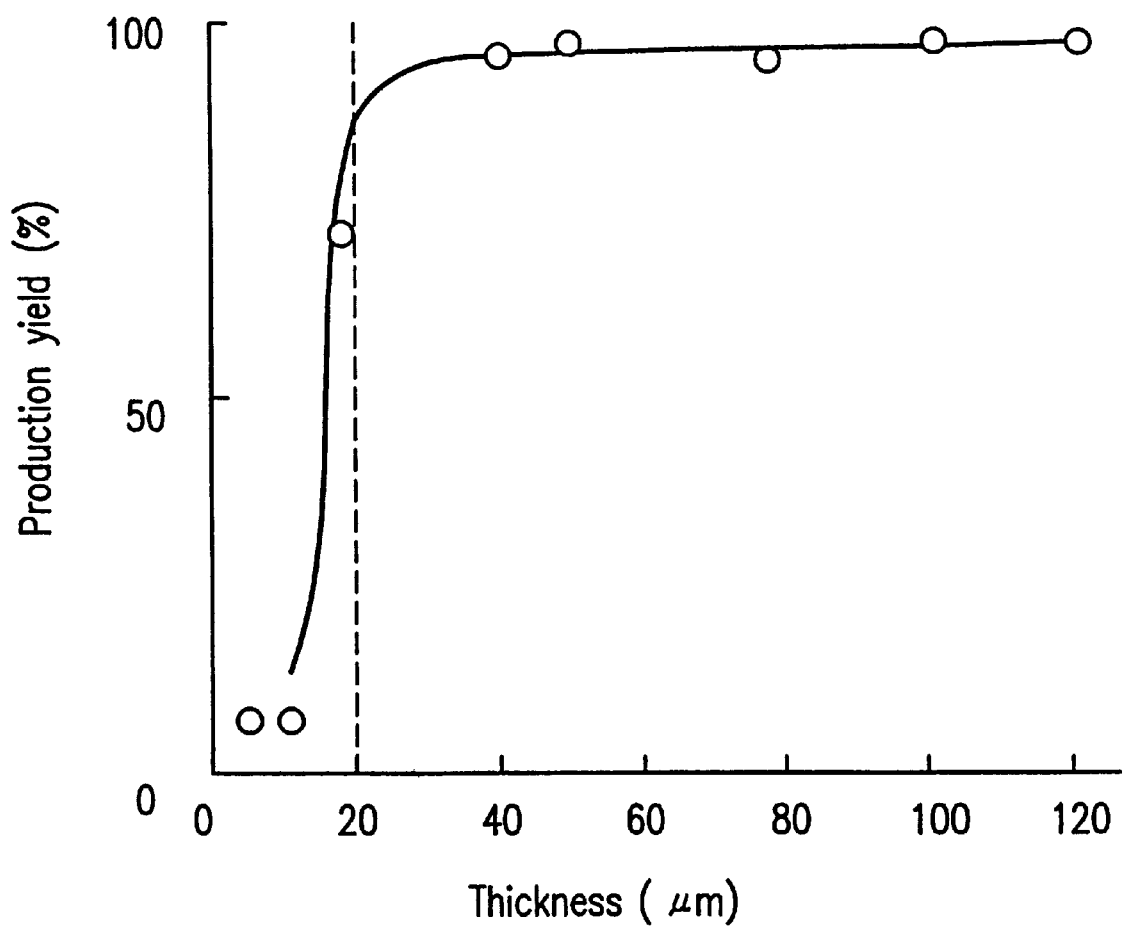
FIG. 3 is a graph illustrating the relationship between the thickness of an n-type $Al_{0.1}Ga_{0.9}N$ substrate and the production yield of a gallium nitride compound semiconductor light emitting device influenced by the cracks in the substrate.
Figure 4:
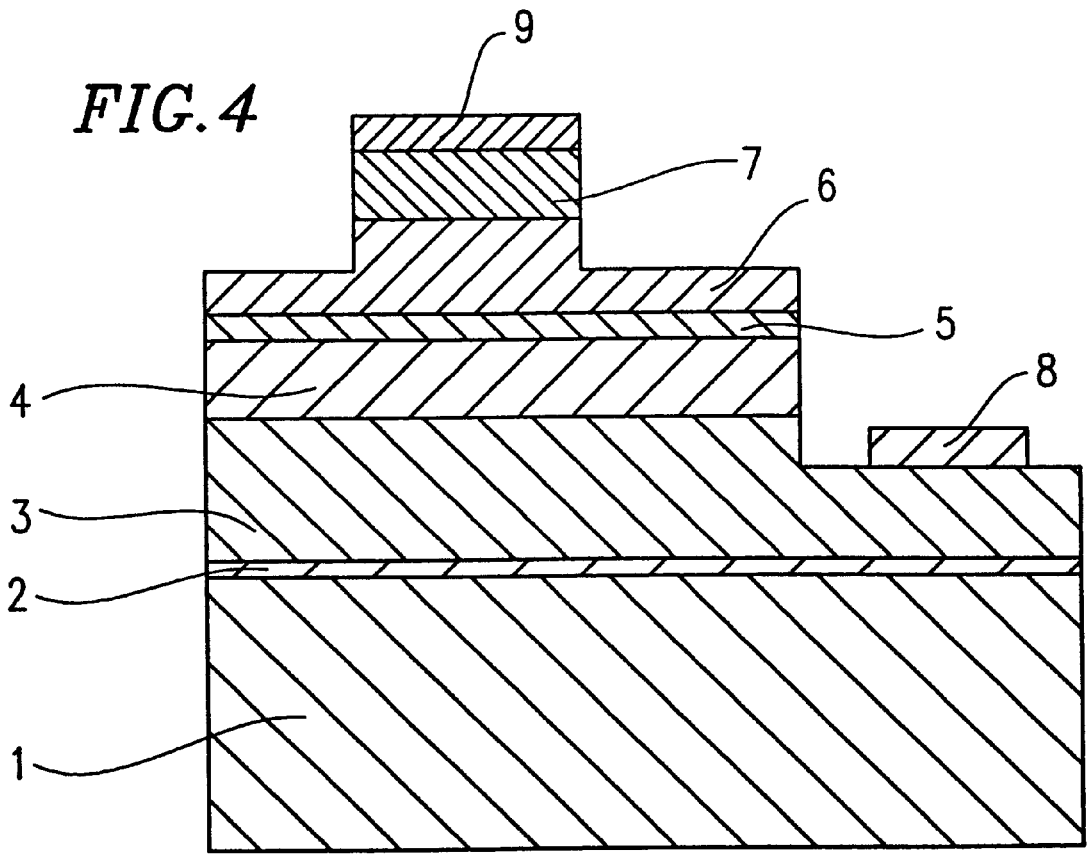
FIG. 4 is a cross-sectional view of a conventional gallium nitride compound semiconductor light emitting device.

FIG. 3 shows the results. As can be seen from FIG. 3, when the thickness of the substrate is about 20 μm or less, the production yield is lowered rapidly. Consequently, the thickness of the substrate is preferably about 20 μm or more.

In the above-described example, the n-type clad layer 11 and the p-type clad layer 13 can have different Al ratios from each other.

The above description is made with regard to the gallium nitride compound semiconductor light emitting device as an example. The present invention is applicable to any semiconductor device including a $Al_xGa_{1-x}N$ (0<x<1) substrate and a first semiconductor layer provided on the substrate and formed of a III-group nitride semiconductor layer containing Al.

As described above, according to the present invention, the difference in the Al ratio between an $Al_xGa_{1-x}N$ (0<x<1) substrate and a first semiconductor layer formed of a III-group nitride semiconductor containing Al is less than about 0.15. Due to such a ratio, the differences in the lattice constant and in the thermal expansion coefficient of the substrate and the first semiconductor layer can be sufficiently reduced. The $Al_xGa_{1-x}N$ substrate has a hardness sufficiently high so as to cause dislocations or cracks to be generated therein.

An active layer formed of a III-group nitride semiconductor having a forbidden band smaller than a forbidden band of the first semiconductor layer, can be provided on the first semiconductor layer: and a second semiconductor layer formed of a III-group nitride semiconductor containing Al and having a different conductivity type from a conductivity type of the first semiconductor layer, can be provided on the active layer. In such an embodiment, the light is sufficiently confined in the active layer while generation of cracks is suppressed.

The difference in the Al ratio between the substrate and the first semiconductor layer, between the first semiconductor layer and the second semiconductor layer, and between the substrate and the second semiconductor layer can all be less than about 0.15. In such an embodiment, the generation of cracks is significantly suppressed as compared to the conventional device. This allows the thickness of each of the first semiconductor layer and the second semiconductor layer to be increased to about 0.5 μm or more. When the differences in the Al ratio between the substrate and the first semiconductor layer, between the substrate and the second semiconductor layer, and between the first semiconductor layer and the second semiconductor layer are each about 0.05 or less, the thickness of each of an n-type clad layer and a p-type clad layer can be increased to about 1.5 μm or more. As a result, the light can be sufficiently confined in the active layer so as to improve the characteristics of the semiconductor device.

In an embodiment in which the substrate has a thickness of about 20 μm or more, the production yield influenced by the cracks in the substrate is prevented from being lowered.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:

a substrate formed of $Al_xGa_{1-x}N$ (0<x<1); and a first semiconductor layer provided on the substrate and formed of a III-group nitride semiconductor containing Al, wherein the difference between an Al ratio of the substrate and an Al ratio of the first semiconductor layer is less than about 0.15.

2. A semiconductor device according to claim 1, further comprising:

an active layer provided on the first semiconductor layer and formed of a III-group nitride semiconductor having a forbidden band smaller than a forbidden band of the first semiconductor layer; and a second semiconductor layer provided on the active layer and formed of a III-group nitride semiconductor containing Al and having a different conductivity type from a conductivity type of the first semiconductor layer.

3. A semiconductor device according to claim 2, wherein the difference between the Al ratio of the substrate and an Al ratio of the second semiconductor layer is less than about 0.15, and the difference between the Al ratio of the first semiconductor layer and the Al ratio of the second semiconductor layer is less than about 0.15.

4. A semiconductor device according to claim 1, wherein the substrate has a thickness of about 20 μm or more.

* * * * *